US012713872B2

(12) United States Patent
Tseng et al.

(10) Patent No.: US 12,713,872 B2
(45) Date of Patent: Aug. 18, 2026

(54) APPARATUS AND METHOD FOR CHARACTERIZATION AND OPTIONAL SORTING AND ASSEMBLY OF MICROELECTRONIC COMPONENTS ACCORDING TO WARPAGE

(71) Applicant: Micron Technology, Inc., Boise, ID (US)

(72) Inventors: Kuan Wei Tseng, Taichung City (TW); Deepti Verma, Boise, ID (US); Tzu Hsien Yu, Taichung City (TW); Brandon P. Wirz, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 1001 days.

(21) Appl. No.: 17/804,683

(22) Filed: May 31, 2022

(65) Prior Publication Data

US 2022/0392792 A1 Dec. 8, 2022

Related U.S. Application Data

(60) Provisional application No. 63/197,868, filed on Jun. 7, 2021.

(51) Int. Cl.
*H10P 72/00* (2026.01)
*H10P 74/00* (2026.01)
(Continued)

(52) U.S. Cl.
CPC ...... *H10P 72/0616* (2026.01); *H10P 72/0611* (2026.01); *H10P 74/23* (2026.01);
(Continued)

(58) Field of Classification Search
CPC ......... H01L 21/67288; H01L 21/67271; H01L 22/20; H01L 24/16; H01L 24/75;
(Continued)

(56) References Cited

U.S. PATENT DOCUMENTS 5,872,694 A * 2/1999 Hoinkis .............. H01L 21/6831
361/234
7,042,072 B1 5/2006 Kim et al.
(Continued)

FOREIGN PATENT DOCUMENTS

CN 107039298 A 8/2017
CN 110400760 A 11/2019
(Continued)

OTHER PUBLICATIONS

KR-102099009-B1, English Translation (Year: 2020).*
(Continued)

*Primary Examiner* — Ryan D Walsh
(74) *Attorney, Agent, or Firm* — TraskBritt

(57) ABSTRACT

This application relates to a method of processing microelectronic components comprising measuring parameter values of at least one of a nature and a degree of warpage of singulated microelectronic components in an unconstrained state and sorting the singulated microelectronic components responsive to the measured parameter values of at least one of the nature and degree of warpage. The sorted dice may be used in assemblies to minimize bond line height variances and resulting open circuits between components. Systems for implementing the methods are also disclosed.

36 Claims, 7 Drawing Sheets

(51) Int. Cl.
*H10W 72/00* (2026.01)
*H10W 90/00* (2026.01)

(52) U.S. Cl.
CPC *H10W 72/07141* (2026.01); *H10W 72/07232* (2026.01); *H10W 90/722* (2026.01)

(58) Field of Classification Search
CPC ........... H01L 24/81; H01L 2224/16148; H01L 2224/75301; H01L 2224/81203; H01L 2924/3511; H01L 2924/3512; H01L 2924/37001
See application file for complete search history.

(56) References Cited

U.S. PATENT DOCUMENTS 9,184,139 B2 11/2015 Choi et al.
9,279,673 B2 3/2016 Ko et al.
10,345,102 B2 * 7/2019 Saito ........................ H01L 22/12
10,446,423 B2 * 10/2019 Su ..................... H01L 21/67288
11,481,887 B2 * 10/2022 Cui ....................... G06F 30/398
2002/0139235 A1 * 10/2002 Nordin ............. H01L 21/67092 83/13
2004/0212389 A1 * 10/2004 Hamren ............... G01R 1/0433 324/750.16
2007/0231934 A1 * 10/2007 Sato ........................ H01L 22/20 257/E21.525
2012/0250277 A1 * 10/2012 Mikado ................ H05K 1/0271 361/752
2015/0371969 A1 12/2015 Yu et al.
2019/0333796 A1 * 10/2019 Huffaker ........... H01L 21/67288
2020/0075371 A1 * 3/2020 Kuo .................. H01L 21/67271
2021/0090954 A1 * 3/2021 Mori ................. H01L 21/67271
2021/0134628 A1 5/2021 Seo et al.
2021/0183682 A1 * 6/2021 Bayless ............... H01L 21/6836
2022/0077018 A1 * 3/2022 Guo ...................... H01L 23/562

FOREIGN PATENT DOCUMENTS

CN 110797307 A 2/2020
CN 112420624 A 2/2021
CN 112447535 A 3/2021
KR 102099009 B1 * 4/2020 ....... H01L 21/67706
WO WO-2008008411 A2 * 1/2008 ....... H01L 21/67288

OTHER PUBLICATIONS

WO-2008008411-A2, English Translation (Year: 2008).*
Chinese First Office Action and Search Report for Chinese Application No. 202210629988.2, dated Mar. 27, 2025, 31 pages with translation.
Taiwanese Search Report and Office Action from Taiwanese Application No. 111120968, dated Aug. 14, 2023, 15 pages with English translation.
Chinese Second Office Action for Chinese Application No. 202210629988.2, dated Aug. 25, 2025, 6 pages with translation.
Chinese Third Office Action for Chinese Application No. 202210629988.2, dated Feb. 6, 2026, 6 pages with translation.

* cited by examiner

APPARATUS AND METHOD FOR CHARACTERIZATION AND OPTIONAL SORTING AND ASSEMBLY OF MICROELECTRONIC COMPONENTS ACCORDING TO WARPAGE

PRIORITY CLAIM

This application claims the benefit of the filing date of U.S. Provisional Patent Application Ser. No. 63/197,868, filed Jun. 7, 2021, for "APPARATUS AND METHOD FOR CHARACTERIZATION AND OPTIONAL SORTING AND ASSEMBLY OF MICROELECTRONIC COMPONENTS ACCORDING TO WARPAGE," the disclosure of which is hereby incorporated herein in its entirety by this reference.

TECHNICAL FIELD

The disclosure relates to processing of individual microelectronic components and, more specifically, to inspecting such microelectronic components to characterize same according to the degree and nature of warpage exhibited by such microelectronic components. The disclosure optionally relates further to sorting of such microelectronic components into different bins (i.e., groups) responsive to the characterization of such warpage, and assembling such sorted microelectronic components with other microelectronic components in superimposition based at least in part on binning to minimize adverse effects of warpage of one or more superimposed microelectronic components in a given assembly.

BACKGROUND

As performance of electronic devices and systems increases, there is an associated demand for improved performance of microelectronic components (e.g., semiconductor dice) of such devices and systems while maintaining or even shrinking the form factor (e.g., length, width and height) of a microelectronic component assembly. Such demands are often, but not exclusively, associated with mobile devices and high-performance systems. To maintain or reduce the footprint and height of an assembly of microelectronic components, three-dimensional (3D) assemblies of stacked components equipped with so-called through silicon vias (TSVs) for vertical electrical (e.g., signal, power, ground/bias) communication between components of the stack have become more common, in combination with the reduction in component thickness, as well as employment of preformed and in situ formed dielectric materials in the bond lines (i.e., spaces between stacked components) to reduce bond line thickness while increasing bond line uniformity. Such preformed dielectric materials include, for example, so-called non-conductive films (NCFs), and wafer level underfills (WLUFs), such terms often being used interchangeably. In situ formed dielectric materials may include silicon oxides as well as extremely thin polymers. While effective in reducing height of 3D microelectronic component assemblies, the reduction in thickness of microelectronic components, for example semiconductor dice, to about 50 μm or less (e.g., 30 μm, 20 μm or less) increases device fragility and susceptibility to micro cracking and cracking under stress, such as compressive (e.g., impact) stress from contact with handling equipment as well as tensile and bending stresses experienced during, for example, picking of the microelectronic component from a support structure with a pick arm or "picker" using a vacuum in a pick and place operation. In addition, the reduction in thickness of individual microelectronic components renders such microelectronic components much more susceptible to warpage in comparison to thicker components (e.g., more than about 50 μm). When microelectronic components exhibiting differing degrees and nature of warpage are stacked, the potential for open joints (i.e., open circuits) or stretched joints (i.e., excessive vertical spread of aligned conductive elements resulting in insufficient solder volume to robustly fill the gap) between conductive elements of superimposed microelectronic components (i.e., between conductive pillars of one component and aligned conductive pads of another component) is exacerbated when warpage increases bond line thickness excessively. In addition, warpage may also create shorted circuits due to solder squeeze out, resulting in contact between laterally adjacent conductive elements when bond line thickness reduces bond line thickness to an unacceptable degree. Further, as bond line thickness is further reduced, for example, when in situ formed dielectric materials are used to achieve near zero bond line (NZB) thickness for hybrid bonding applications, very minimal warpage of a microelectronic component may initiate an open joint if such warpage is not identified and accommodated due to the absence of solder in the conductive joints between components. In addition, stresses between superimposed components responsive to thermocompression bonding of components may be concentrated at individual isolated locations between components rather than being distributed substantially evenly over an entire footprint of the superimposed components, potentially initiating micro cracking of components. Non-limiting examples of microelectronic component assemblies including multiple stacked, thin microelectronic components which may suffer from open circuits as well as from stress-induced cracking due to warpage of one or more superimposed components include assemblies of semiconductor memory dice, alone or in combination with other die functionality (e.g., logic) include so-called high bandwidth memory (HBMx), hybrid memory cubes (HMCs), and chip to wafer (C2W) assemblies.

DETAILED DESCRIPTION

Figure 1:
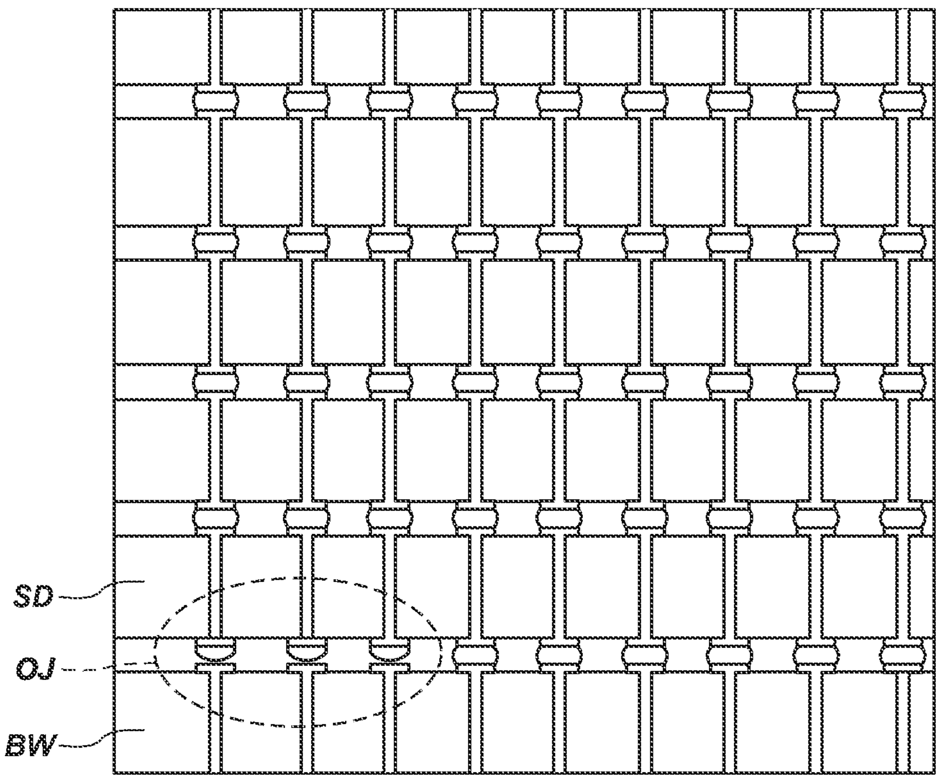
FIG. 1 is a rendering based on a photomicrograph of stacked microelectronic components wherein open circuits have occurred in the circled dotted line area due to warpage of one or more components.

Apparatus for handling and inspecting individual microelectronic components for degree and nature of warpage are disclosed. As used herein, the "degree" of warpage means the magnitude of departure (positive or negative) of locations on a microelectronic component substrate, from an ideal plane (i.e., flat) of the microelectronic component in a positive or negative direction perpendicular to the substrate. As used herein, the term "nature" of warpage means shape (e.g., topography) of the substrate warpage within the periphery of the substrate. According to the disclosure, warpage may be characterized in terms of at least one of degree and nature. Optionally, the apparatus may further include a sorting function for binning individual microelectronic components characterized according to exhibited degree and nature of warpage, and a retrieving function comprising selecting binned microelectronic components for disposition in a storage platform or for stacking, for example, on a wafer, or on another individual microelectronic component, to minimize variations in bond line thickness between components and a wafer in C2W stacking, or between components of a multi-component stack.

The following description provides specific details, such as sizes, shapes, and orientations in order to provide a thorough description of embodiments of the disclosure. However, a person of ordinary skill in the art will understand and appreciate that the embodiments of the disclosure may be practiced without necessarily employing these specific details, as embodiments of the disclosure may be practiced in conjunction with conventional fabrication techniques employed in the industry. In addition, the description provided below may not form a complete process flow for inspection and physical handling of microelectronic components or apparatus for effecting such inspection and physical handling. Only those process acts and structures necessary to understand the embodiments of the disclosure are described in detail below. Additional acts to handle microelectronic components or to fabricate a complete electronic device or system as described herein may be performed by conventional fabrication processes.

Drawings presented herein are for illustrative purposes only, and are not meant to be actual views of any particular material, component, structure, device, or system. Variations from the shapes depicted in the drawings as a result, for example, of manufacturing techniques and/or tolerances, are to be expected. Thus, embodiments described herein are not to be construed as being limited to the particular shapes or regions as illustrated, but include deviations in shapes that result, for example, from manufacturing. For example, a region illustrated or described as box-shaped may have rough and/or nonlinear features, and a region illustrated or described as round may include some rough and/or linear features. Moreover, sharp angles between surfaces that are illustrated may be rounded, and vice versa. Thus, the regions illustrated in the figures are schematic in nature, and their shapes are not intended to illustrate the precise shape of a region and do not limit the scope of the present claims. The drawings are not necessarily to scale.

The embodiments may be described in terms of a process that is depicted as a flowchart, a flow diagram, a structure diagram, or a block diagram. Although a flowchart may describe operational acts as a sequential process, many of these acts can be performed in another sequence, in parallel, or substantially concurrently. In addition, the order of the acts may be re-arranged. A process may correspond to a method, a thread, a function, a procedure, a subroutine, a subprogram, other structure, or combinations thereof. Furthermore, the methods disclosed herein may be implemented in hardware, software, or both. If implemented in software, the functions may be stored or transmitted as one or more instructions or code on computer-readable media. Computer-readable media includes both computer storage media and communication media including any medium that facilitates transfer of a computer program from one place to another.

Any reference to an element herein using a designation such as "first," "second," and so forth does not limit the quantity or order of those elements, unless such limitation is explicitly stated. Rather, these designations may be used herein as a convenient method of distinguishing between two or more elements or instances of an element. Thus, a reference to first and second elements does not mean that only two elements may be employed there or that the first element must precede the second element in some manner. In addition, unless stated otherwise, a set of elements may comprise one or more elements.

As used herein, the terms "comprising," "including," "containing," "characterized by," and grammatical equivalents thereof are inclusive or open-ended terms that do not exclude additional, unrecited elements or method acts, but also include the more restrictive terms "consisting of" and "consisting essentially of" and grammatical equivalents thereof. As used herein, the term "may" with respect to a material, structure, feature or method act indicates that such is contemplated for use in implementation of an embodiment of the disclosure and such term is used in preference to the more restrictive term "is" so as to avoid any implication that other, compatible materials, structures, features and methods usable in combination therewith should or must be, excluded.

As used herein, the terms "longitudinal," "vertical," "lateral," and "horizontal" are in reference to a major plane of a substrate (e.g., base material, base structure, base construction, etc.) in or on which one or more structures and/or features are formed and are not necessarily defined by earth's gravitational field. A "lateral" or "horizontal" direction is a direction that is substantially parallel to the major plane of the substrate, while a "vertical" direction is a direction that is substantially perpendicular to the major plane of the substrate. The term "longitudinal" may be used in context to denote a length direction or dimension of a substrate, while the term "lateral" may be used to designate a width direction or dimension of a substrate. The major plane of the substrate is defined by a surface of the substrate having a relatively large area compared to other surfaces of the substrate.

As used herein, spatially relative terms, such as "beneath," "below," "lower," "bottom," "above," "over," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "over" or "above" or "on" or "on top of" other elements or features would then be oriented "below" or "beneath" or "under" or "on bottom of" the other elements or features. Thus, the term "over" can encompass both an orientation of above and below, depending on the context in which the term is used, which will be evident to one of ordinary skill in the art. The materials may be otherwise oriented (e.g., rotated 90 degrees, inverted, flipped) and the spatially relative descriptors used herein interpreted accordingly.

As used herein, the singular forms "a," "an," and "the" are intended to include the plural forms as well, unless the context clearly indicates otherwise.

As used herein, the terms "configured" and "configuration" refer to a size, shape, material composition, orientation, and arrangement of one or more of at least one structure and at least one apparatus facilitating operation of one or more of the structure and the apparatus in a predetermined way.

As used herein, the term "substantially" in reference to a given parameter, property, or condition means and includes to a degree that one of ordinary skill in the art would understand that the given parameter, property, or condition is met with a degree of variance, such as within acceptable manufacturing tolerances. By way of example, depending on the particular parameter, property, or condition that is substantially met, the parameter, property, or condition may be at least 90.0% met, at least 95.0% met, at least 99.0% met, or even at least 99.9% met.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein the terms "layer" and "film" mean and include a level, sheet or coating of material residing on a structure, which level or coating may be continuous or discontinuous between portions of the material, and which may be conformal or non-conformal, unless otherwise indicated.

As used herein, the term "substrate" means and includes a base material or construction upon which additional materials are formed. The substrate may be a semiconductor substrate, a base semiconductor layer on a supporting structure, a metal electrode, or a semiconductor substrate having one or more materials, layers, structures, or regions formed thereon. The materials on the semiconductor substrate may include, but are not limited to, semiconductive materials, insulating materials, conductive materials, etc. The substrate may be a conventional silicon substrate or other bulk substrate comprising a layer of semiconductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped. As used herein, the term "may" with respect to a material, structure, feature or method act indicates that such is contemplated for use in implementation of an embodiment of the disclosure and such term is used in preference to the more restrictive term "is" so as to avoid any implication that other, compatible materials, structures, features and methods usable in combination therewith should or must be excluded.

As used herein, the term "microelectronic component" means and includes by way of non-limiting example, semiconductor die, die exhibiting functionality through other than semiconductive activity, microelectrical mechanical systems (MEMs) devices, substrates comprising multiple die including conventional wafers as well as other bulk substrates as mentioned above, and partial wafers and substrates including more than one die location.

In the description and for the sake of convenience, the same or similar reference numerals may be used to identify features and elements common between various drawing figures.

Referring now to FIG. 1 of the drawings by way of background specific to embodiments of the disclosure and as mentioned above, as packaging size requirements (i.e., form factor) become smaller, not only the footprint, but also the thickness of each microelectronic component (e.g., semiconductor die) in an assembly of stacked components must be reduced. Semiconductor dice as thin as about 50 μm have been commercialized, and semiconductor dice as thin as about 30 μm or less (e.g., about 20 μm) are under development. The current trend toward such ultra-thin microelectronic components in the form of semiconductor dice, particularly when memory devices include large numbers (e.g., 8, 12, 16 or more) of stacked memory dice alone or in combination with a logic die as well as other combinations of stacked dice (e.g., HMC, HBMx, C2W) will continue as stack heights for a given number of dice are required to be maintained or even reduced, for example, for use in mobile devices. Further, such ultra-thin dice may be employed in conjunction with implementation of near zero bond line (NZB) spacing between adjacent stacked dice. One example of NZB development involves hybrid bonding between adjacent stacked dice using plasma-activated silicon oxide from a die or an ultra-thin polymer as the bond line dielectric to bond adjacent dice and to maintain a metal to metal contact interface through the bond line between conductive elements connecting integrated circuitry of adjacent, superimposed dice. Avoiding disparities in bond line thickness in such applications across the length and width of the footprint of a semiconductor die superimposed on or located under another die or on a base wafer due to mismatched topography of adjacent surfaces resulting from warpage of one or both adjacent surfaces may reduce open joints and short circuits as well as reduce mechanical stress on the component substrates due to point contact and stress concentrations. Reducing the potential for open joints and short circuits as well as stress concentrations between such components during assembly becomes ever more significant to preventing yield loss (i.e., percent of defective dice yielded from a given wafer or other substrate, batch of wafers or substrates, or percent of defective assemblies) resulting from mismatched warpage of the ultra-thin semiconductor dice during chip to wafer (C2W) or multiple die stack processing (e.g., thermocompression bonding).

While many sources of open joints, stretched joints and short circuits as well as micro cracking and cracking of microelectronic components are known, one particular damage-inducing mechanism in the form of component warpage has become evident as thickness of such components is reduced below about 65 μm, and has developed into a significant problem as component thickness is further reduced to about 50 μm and less. By way of relevant background, large numbers (e.g., thousands) of microelectronic components in the form of semiconductor dice may be fabricated on a single semiconductor (e.g., silicon) wafer. After integrated circuitry at mutually laterally spaced die locations is formed in and over the so-called active surface comprising integrated circuitry in conjunction with conductive through silicon vias (TSVs) extending from the integrated circuitry toward the back side of the wafer followed by back end of line (BEOL) processing, the wafer is thinned from an initial thickness, typically in the 600 μm to 750 μm range, to a final significantly reduced thickness, now of about 50 μm, exposing ends of the TSVs, if present. Subsequently, the thinned wafer, adhesively secured to a support structure in the form of a polymer mounting film (sometimes termed a "mount tape") supported peripherally on a film frame, is separated, or "singulated," into discrete semiconductor dice using, for example, a diamond-coated wafer saw, a plasma dicing process, or a so-called "stealth" dicing process. After singulation, the mounting film is stretched laterally on the frame to separate the singulated dice, which are then picked one by one from the mounting film by a picker having vacuum channels connected to a vacuum source and opening onto a pick face in close proximity to each target die. In many instances, an ejector pushing the die to be picked from under the mounting film upwardly in conjunction with upward movement of the picker as a vacuum is initiated in the vacuum channels is employed to facilitate release of the die from the adhesive of the film. In some instances, individual dice are picked from the mounting film by the picker, inverted, transferred to a bond tip of a bond head of a thermocompression bonding apparatus, and placed on a base wafer or on another, already placed die. In other instances, the individual dice are picked from the mounting film, optically inspected and placed in pockets of a chip tray or of a tape being wound into a reel of a so-called tape and reel apparatus for transport, handling and subsequent picking of the dice from each pocket for assembly with other components.

Conventionally, before a singulated semiconductor die is picked from the adhesive on a mounting film with a conventional picker including multiple vacuum channels opening onto a downward facing pick face moved to a position immediately above the semiconductor die, the upward facing active surface of the die may be inspected optically for undersize, misshapen or missing conductive elements (e.g., conductive pillars with or without solder caps, solder bumps), as well as for surface and edge cracks. Similarly, the back side of the die may be inspected after picking and before transfer to a bond tip of a thermocompression bond head. However, the degree and nature of warpage of the singulated semiconductor die is not ascertained before or during picking and transfer, which may become problematic as it has been determined by the inventors herein that the degree and nature of die warpage may vary widely within the expanse of a semiconductor wafer, particularly an ultra-thin wafer, between various die locations of the wafer. FIG. 1 illustrates, in the dotted circled area, open joints OJ between solder-tipped conductive elements of a lowermost semiconductor die SD and aligned conductive elements of a base wafer BW due to warpage of the die.

Figure 2:
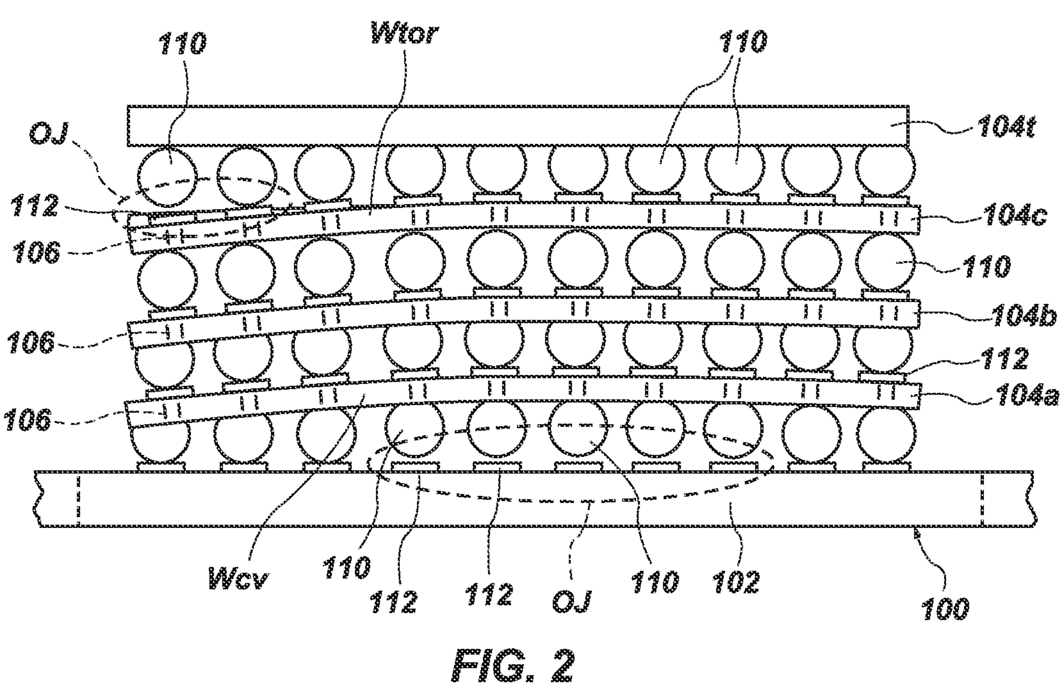
FIG. 2 is a side schematic elevation of an electronic device under fabrication including multiple DRAM dice stacked on an unsingulated die location of a base substrate.

When incorporated in a multi-die stacked die electronic device, die warpage may become very significant in terms of product yield. For example, an electronic device including a logic die having a large number (e.g., twelve, sixteen) of superimposed dynamic random access memory (DRAM) dice stacked thereon may be rendered inoperable by a single warped die in the stack compromising electrical connections in the stack with open joints or short circuits. Even potentially more serious is the occurrence of stretched joints, which may pass infant mortality testing but fail later during operation of a system (i.e., mobile device, tablet, laptop, etc.) incorporating the assembly. While die warpage, depending on the nature and degree of same, may cause issues anywhere in a die stack, it appears to have the most potential for compromising operation of the electronic device when occurring in a first layer die on an unsingulated die location of a base substrate (e.g., semiconductor wafer) or in a next to uppermost die in a die stack. Both the base substrate and the uppermost die are generally substantially more rigid and thus substantially planar (i.e., any warpage is within minute tolerances, less than about 10 μm across a wafer) than intermediate dice in the stack, which may exhibit a warpage of up to about 100 μm across a single die. While the base wafer may only be of a thickness between about 30 μm and about 50 μm, it is adhesively bonded to a much thicker (e.g., about 700 μm to about 725 μm) carrier wafer, resulting in a rigid assembly of about 775 μm total presenting a substantially planar upper surface of the base wafer. The uppermost die may currently be, for example, of a thickness of about 310 μm, and generally greater than about 100 μm, and thus exhibiting minimal warpage. While the use of NCF in bond lines and thermocompression bonding may help reduce die warpage in the resulting semiconductor die package, it is difficult if not impossible to completely eliminate die warpage. As a result, the disposition of a warped die in a first die layer onto a base substrate, or as a next to uppermost die in a die stack is more likely to cause an open or stretched joint in the bond line in areas where warpage moves a portion of the die substrate and consequently active surface and back side vertically from an ideal plane of the die, and thus conductive elements (i.e., pillars or terminal pads) protruding therefrom away from aligned conductive elements (i.e., terminal pads or pillars). These phenomena are depicted in simplified form in FIG. 2, wherein a base substrate in the form of a semiconductor wafer 100 including multiple unsingulated substantially planar die locations 102 thereon has four DRAM (e.g., SDDR5 DRAM) dice stacked thereon, including three ultra-thin (e.g., about 50 μm or less) lower DRAM dice 104*a*, 104*b* and 104*c* including TSVs 106 and an upper, thicker DRAM die 104*t* devoid of TSVs. As shown, convex warpage Wcv of DRAM die 104*a* has lifted conductive pillars 110 (shown as enlarged bumps for simplicity) in the middle of the footprint of die 104*a* upward and away from terminal pads 112 of planar die location 102, creating open joints OJ. Similarly, torsional warpage Wtor of DRAM die 104*c* has pulled terminal pads 112 proximate a longitudinal end of the die footprint downward and away from conductive pillars 110 of substantially planar upper, thicker DRAM die 104*t*. The middle DRAM die 104*b* between DRAM dice 104*a* and 104*c* may or may not exhibit significant warpage but, if present, any warpage differential between DRAM dice 104*a*, 104*b* and 104*c* is generally accommodated due to combined flexibility of the ultra-thin dice 104*a*-104*c* under thermo-compression bonding employed to cure the bond line dielectrics (not shown) and bond aligned conductive elements (i.e., conductive pillars 110 and terminal pads 112) via solder reflow or diffusion bonding. It is noteworthy that the use of diffusion bonding (i.e., of copper pillars to copper terminal pads) may be even less forgiving of die warpage in the absence of solder to accommodate variations in standoff between superimposed conductive elements.

FIGS. 3A, 3B, 3C and 3D illustrate, by way of example only, different types (i.e., natures) and degrees of die warpage, the degree of warpage being exaggerated for clarity.

Figure 3A:
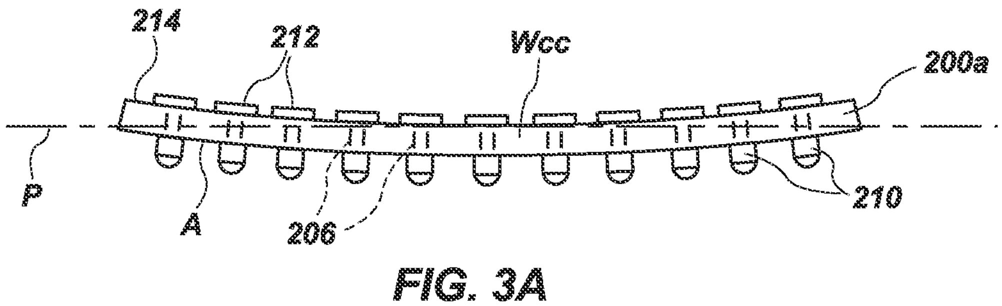
FIG. 3A is a side schematic elevation of a microelectronic component exhibiting longitudinal concave warpage.

FIG. 3A is a side schematic elevation of a microelectronic component in the form of semiconductor die 200*a* having solder-capped conductive pillars 210 projecting from active surface A, terminal pads 212 on a back side 214 of the die 200*a*, and through silicon vias (TSVs) 206 extending between active surface A and terminal pads 212. Concave warpage Wcc from one end of semiconductor die 200*a* to the other pulls conductive pillars 210 and terminal pads 212 away from flat plane P, desirable for robust connections to terminal pads and conductive pillars of adjacent components.

Figure 3B:
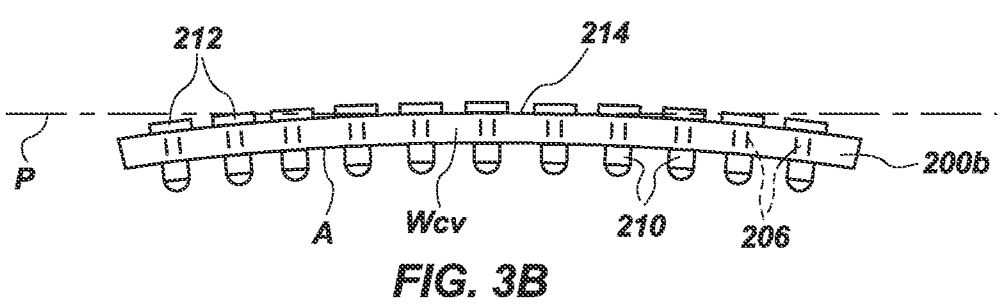
FIG. 3B is a side schematic elevation of a microelectronic component exhibiting longitudinal convex warpage.

FIG. 3B is a side schematic elevation of a microelectronic component in the form of semiconductor die 200*b* having solder-capped conductive pillars 210 projecting from active surface A, terminal pads 212 on a back side 214 of the semiconductor die 200*b*, and through silicon vias (TSVs) 206 extending between active surface A and terminal pads 212. Convex warpage Wcv from one end of semiconductor die 200*b* to the other pulls conductive pillars 210 and terminal pads 212 away from flat plane P, desirable for robust connections to terminal pads and conductive pillars of adjacent components.

Figure 3C:
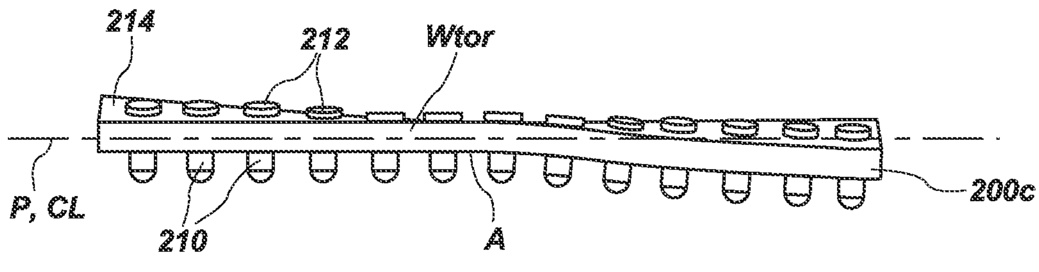
FIG. 3C is an end schematic elevation of a microelectronic component exhibiting a twisted warpage along a centerline thereof.

FIG. 3C is an end schematic elevation of a microelectronic component in the form of semiconductor die 200*c* having solder-capped conductive pillars 210 projecting from active surface A, terminal pads 212 on a back side 214 of the semiconductor die 200*c*, and through silicon vias (TSVs) (not shown) extending between active surface A and terminal pads 212. Twisted (i.e., torsional) warpage Wtor along centreline CL from one end of semiconductor die 200*c* to the other pulls and pushes conductive pillars 210 and terminal pads 212 away from flat planes P, desirable for robust connections to terminal pads and conductive pillars of adjacent components.

Figure 3D:
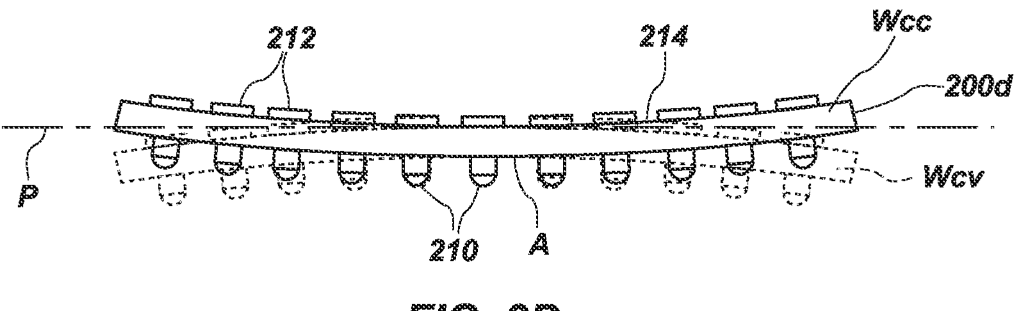
FIG. 3D is an end schematic elevation of a microelectronic component exhibiting, alternatively (i.e., solid versus broken lines) substantially uniform lateral concave and convex warpage along a centerline thereof.

FIG. 3D is an end schematic elevation of a microelectronic component in the form of semiconductor die 200*d* having conductive pillars 210 projecting from active surface A, terminal pads 212 on a back side 214 of the die 200*d*, and through silicon vias (TSVs) (not shown) extending between active surface A and terminal pads 212. Concave warpage Wcc from one side of semiconductor die 200*d* to the other along centreline CL or, alternatively, convex warpage Wcv shown in broken lines pushes conductive pillars 210 and terminal pads 212 away from flat plane P, desirable for robust connections to terminal pads and conductive pillars of adjacent components.

Figure 4:
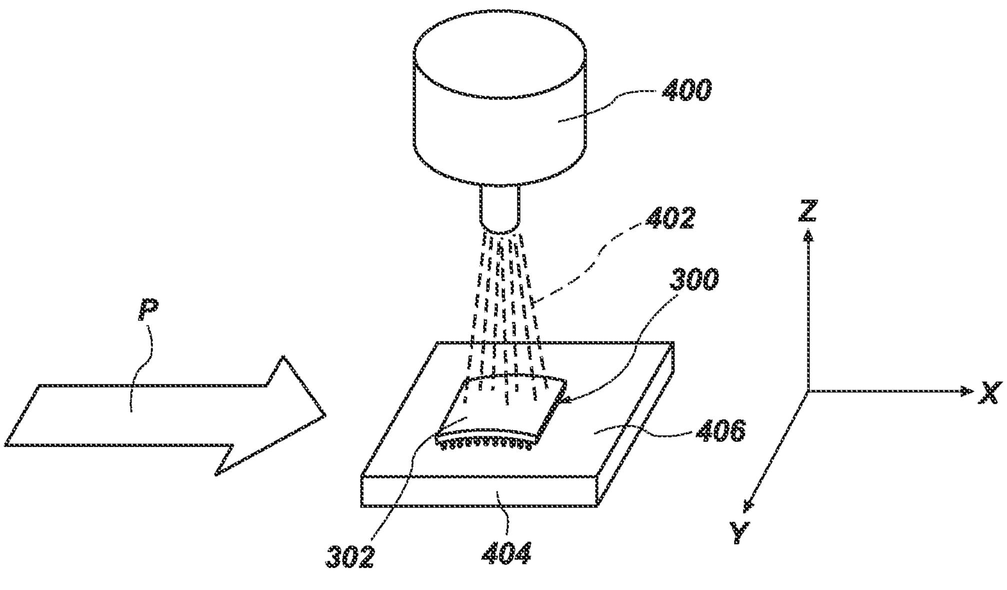
FIG. 4 is a schematic perspective view of a microelectronic component being subjected to a scan of a back side thereof to measure a nature and degree of warpage of the component with respect to a desired flat plane of the component.
Figure 4A:
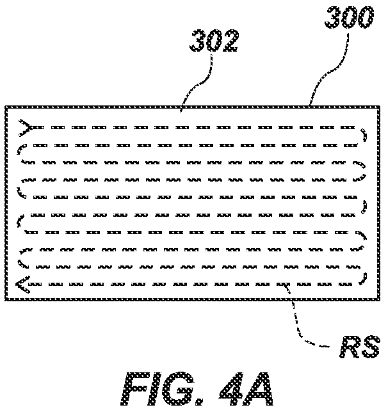
FIG. 4A is a top elevation of the microelectronic component of FIG. 4 showing the path of a raster scan of the back side across the width and length of the component.
Figure 4B:
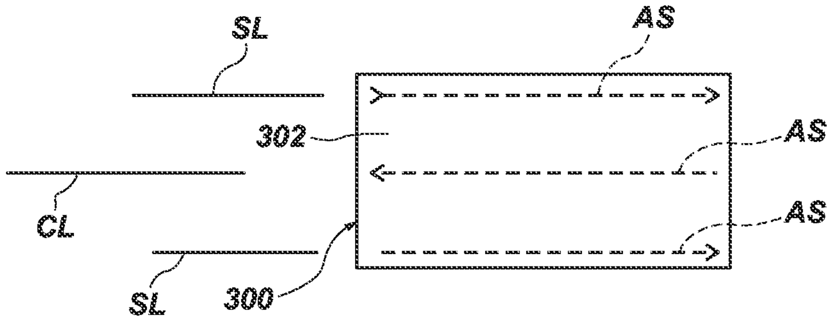
FIG. 4B is a top elevation of the microelectronic component of FIG. 4 showing the path of an abbreviated scan along the centreline and, optionally, longitudinal sidelines adjacent edges of the component.

FIG. 4 is a schematic perspective illustration of a microelectronic component in the form of an unconstrained semiconductor die 300 residing with back side 302 facing upward on a platform 404 being scanned by a profiling apparatus 400 directing energy (e.g., laser) beam 402 along a length X and across a width Y thereof to measure vertical deviations along the Z axis from planarity, as represented by plane P parallel to upper surface 406 of platform 404, at various locations within a footprint of semiconductor die 300. In some instances profiling apparatus 400 may be configured to scan an entire width or length of a semiconductor die 300 in a single pass. For example, the LJ-X8060 sensor head for the LJ-X8000 laser profiler commercially available from Keyence Corporation of America, Itasca, IL offers a scan width of 16 mm. In another example, FIG. 4A illustrates a nonlimiting example of a longitudinal raster scan path RS of laser beam 402 from profiling apparatus 400 in broken lines, such a path covering substantially all of the back side 302 of semiconductor die 300 and providing a detailed warpage topography in terms of nature and degree of warpage of semiconductor die 300. Of course, the raster scan path RS may be implemented as a lateral path across the width of the back side 302 of semiconductor die 300. In a further example, FIG. 4B illustrates a nonlimiting example of an abbreviated scan path AS along the centerline CL of the back side 302 of semiconductor die 300 and, optionally, along sidelines SL immediately adjacent longitudinal edges of the die. While the former raster scan path RS provides exceptional detail, either variant of the latter abbreviated scan path AS may be executed more rapidly yet still provide sufficient detail of the nature and extent of any warpage. Empirical data from scans of multiple semiconductor dice of the same type singulated from a number of like-sized wafers exhibiting the same circuit architecture and processed in the same manner may be analysed and used to predict a desirable degree of scanning and profiling. Additional suitable, commercially available apparatus for scanning microelectronic components for nature and degree of warpage include 2D/3D LJ-X7000 series laser profilers, in combination with the LJ-X8002 Controller, available from Keyence Corporation of America. Other suitable laser profiling apparatus are offered by Cognex Corporation, Natick, MA, and LMI Technologies of Vancouver, British Columbia. Suitable optical profilers are offered by KLA Corporation of Milpitas, CA, Zygo Corporation of Middlefield, CT and Bruker Corporation of Billerica, MA.

It is contemplated that measurements of nature and degree of warpage of microelectronic components according to embodiments of the disclosure may be affected at ambient (≈25° C.). While it is known that degree (i.e., magnitude) of warpage is affected by temperature, it has been determined by the inventors herein that the nature (i.e., type of warpage) exhibited at ambient temperature is indicative of (i.e., substantially correlates to) the nature of warpage exhibited as temperature is elevated or reduced relative to ambient. Thus, using mathematical modelling, empirical data, or a combination thereof to predict degree of warpage as a variable of temperature, an acceptable degree of warpage under process conditions (e.g., thermocompression bonding) may be determined in the context of ambient temperature warpage to establish predetermined values of degrees of exhibited warpage of a given nature against which measured, ambient temperature warpage of a microelectronic component may be compared for sorting and binning purposes. Similarly, the bin associated with a given microelectronic component may be used to predict that component's suitability for superimposition on a planar, base substrate or above or below another microelectronic component of known planarity or warpage characteristics at elevated temperatures to maintain bond line height between such superimposed structures within acceptable tolerances to markedly reduce any potential for open or stretched (if solder is employed) joints.

Figure 5:
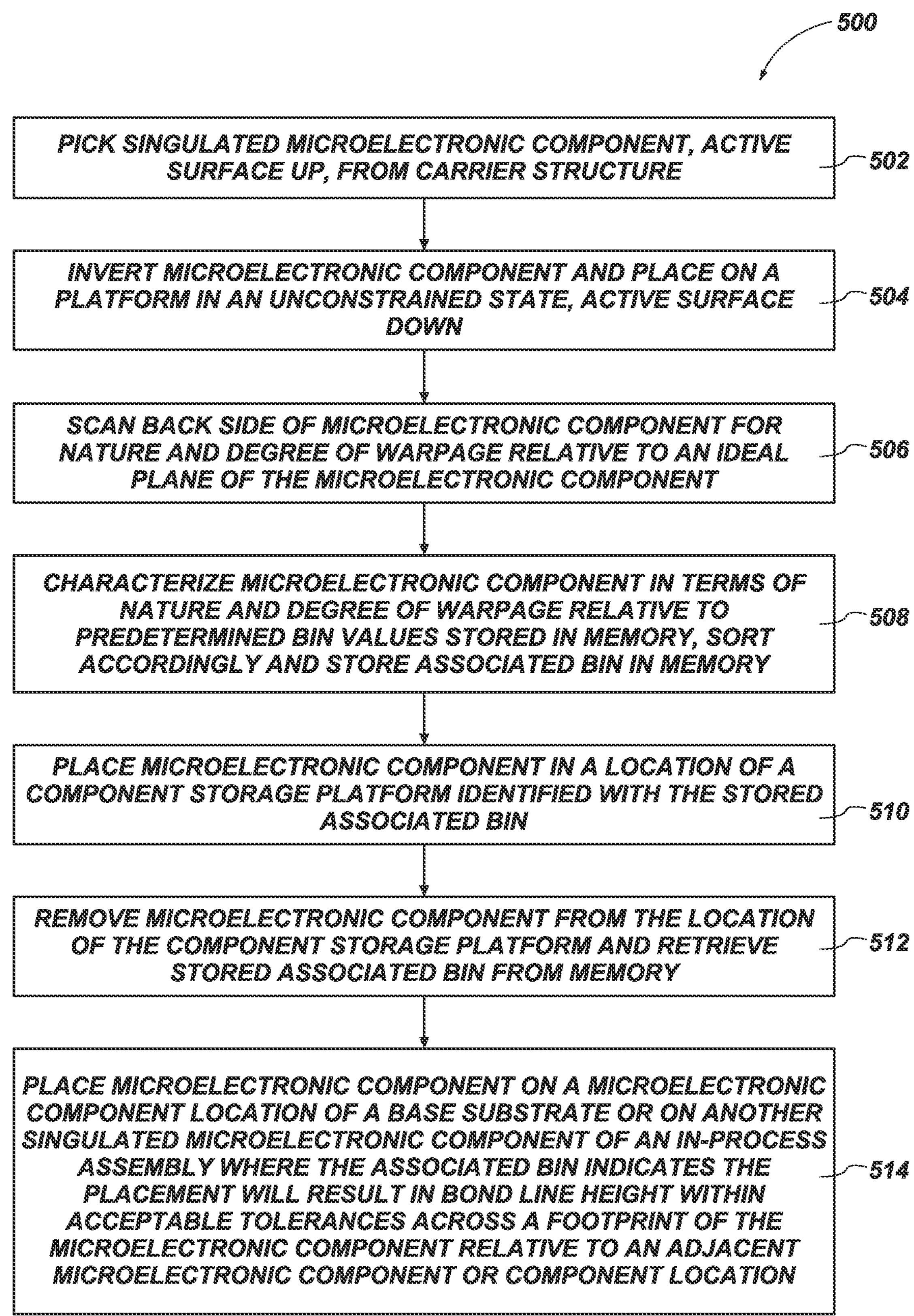
FIG. 5 is a flow diagram of an embodiment of a method of inspecting, characterizing and binning a microelectronic component according to warpage, storing and optionally subsequently placing the binned microelectronic component in an in-process assembly.

FIG. 5 is a flow diagram of a nonlimiting method 500 of characterization, sorting, storage and assembly of a microelectronic component according to an embodiment of the disclosure. In act 502 of method 500, a singulated microelectronic component is picked, face up, from a carrier structure, for example, a mounting film or a carrier wafer. In act 504, the microelectronic component is inverted and placed on a platform in an unconstrained state, active surface down. In act 506, the back side of the microelectronic component is scanned for nature and degree of warpage of the microelectronic component relative to an ideal plane of the microelectronic component. In act 508, the microelectronic component is characterized in terms of nature and degree of warpage relative to predetermined bin values (i.e., warpage types and orientations, departures from planarity, different ranges of the foregoing) stored in memory (e.g., one or more lookup tables), sorted accordingly, and the associated bin of the microelectronic component is stored in memory. In act 510, the microelectronic component is placed in a location of a component storage platform (e.g., pocket of a tape of a tape and reel device, pocket of a chip tray) identified with the stored associated bin. In act 512, the microelectronic component is removed from the location of the component storage platform and the stored associated bin is retrieved from memory. In act 514, the microelectronic component is placed on a microelectronic component location of a base substrate or on another singulated microelectronic component of an in-process assembly where the associated bin indicates the placement will result in bond line height within acceptable tolerances across a footprint of the microelectronic component relative to an adjacent microelectronic component or component location.

Figure 6:
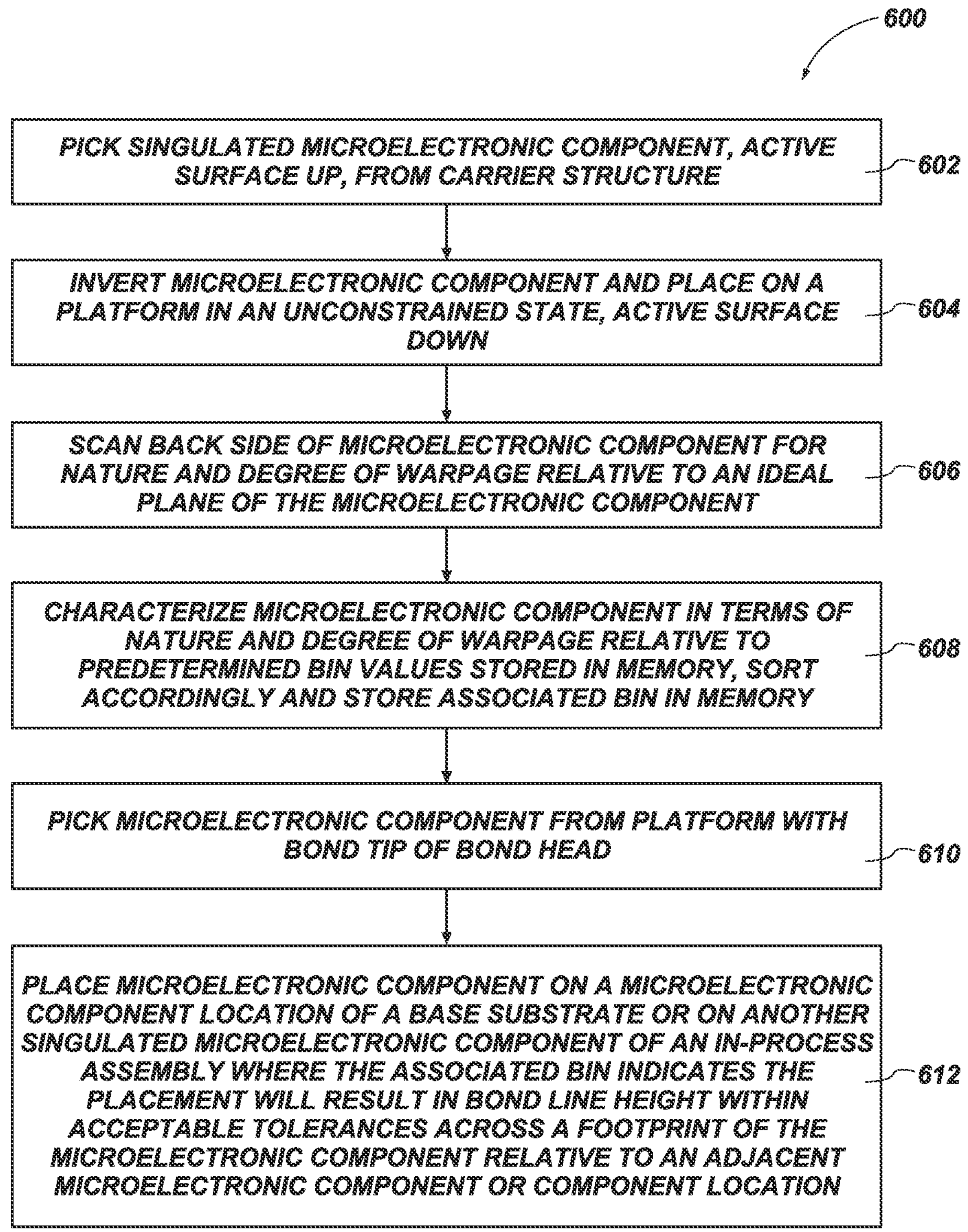
FIG. 6 is a flow diagram of another embodiment of a method of inspecting, characterizing and binning a microelectronic component according to warpage and placing the binned microelectronic component in an in-process assembly.

FIG. 6 is a flow diagram of a nonlimiting method 600 of characterization, sorting and assembly of a microelectronic component according to an embodiment of the disclosure. In act 602 of method 600, a singulated microelectronic component is picked, face up, from a carrier structure, for example, a mounting film or a carrier wafer. In act 604, the microelectronic component is inverted and placed on a platform in an unconstrained state, active surface down. In act 606, the back side of the microelectronic component is scanned for nature and degree of warpage of the microelectronic component relative to an ideal plane of the microelectronic component. In act 608, the microelectronic component is characterized in terms of nature and degree of warpage relative to predetermined bin values stored in memory (e.g., one or more lookup tables), sorted accordingly, and the associated bin of the microelectronic component is stored in memory. In act 610, the microelectronic component is picked from the platform with a bond tip of a bond head of a thermocompression bonding apparatus. In act 612, the microelectronic component is placed on a microelectronic component location of a base substrate or on another singulated microelectronic component of an in-process assembly where the associated bin stored in memory indicates the placement will result in bond line height within acceptable tolerances across a footprint of the microelectronic component relative to an adjacent microelectronic component or component location.

Figures 7A, 7B:
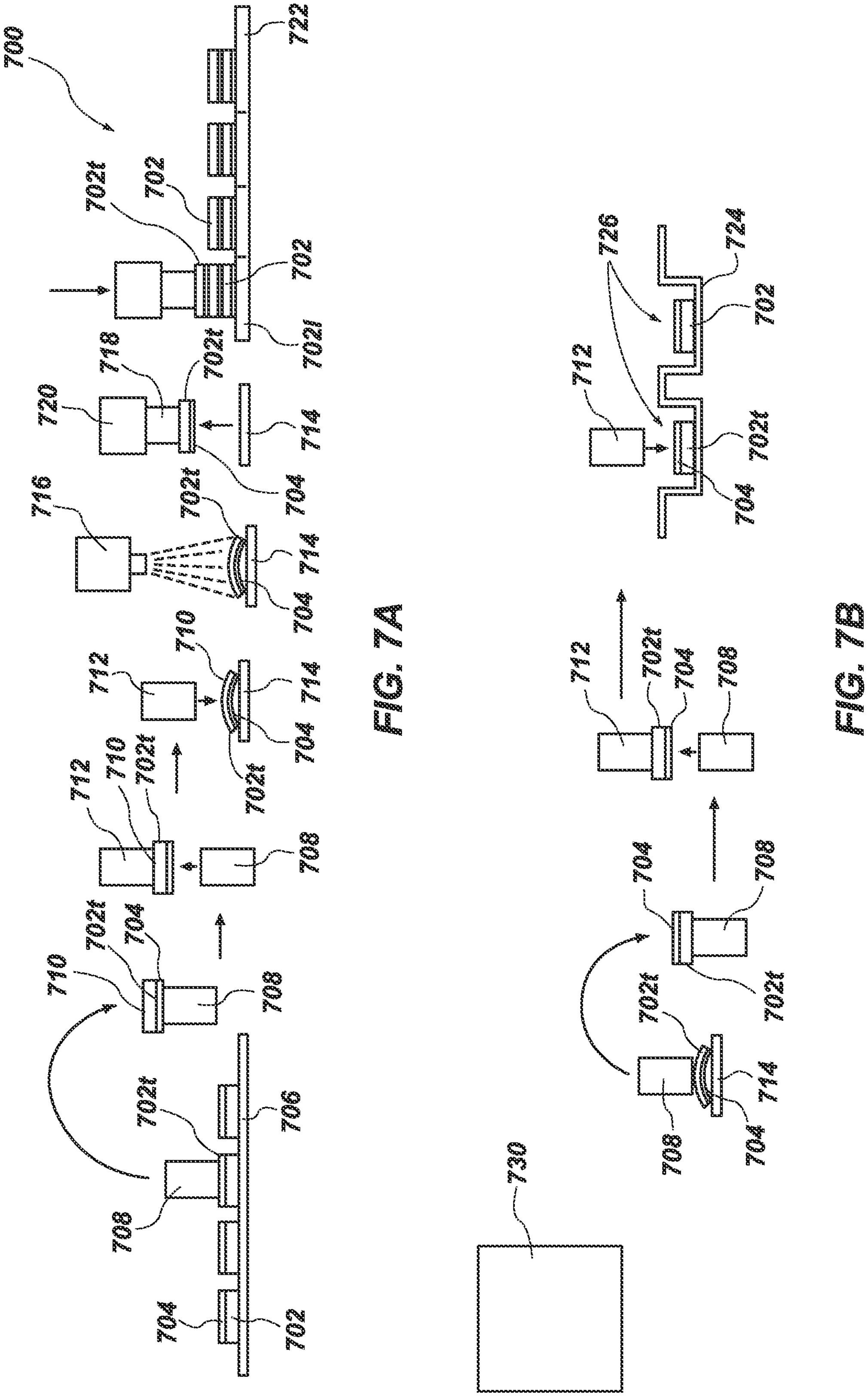
FIGS. 7A and 7B schematically illustrate a system for implementing embodiments of the disclosure.

FIGS. 7A and 7B schematically illustrate an embodiment of a system 700 for implementing acts associated with methods of the disclosure. Referring first to FIG. 7A, singulated microelectronic components in the form of semiconductor dice 702 with active surfaces 704 up reside on a carrier structure 706, for example, a mounting film (i.e., mount tape) or a carrier wafer, a target die **702*t* being picked from carrier structure 706 by a vacuum-equipped pick arm 708 movable in X, Y and Z directions as well as about horizontal and vertical axes. Vacuum-equipped pick arm 708 is then moved laterally and rotated about a horizontal axis to present target die 702*t* back side 710 facing up to vacuum-equipped transfer arm 712 movable at least in X, Y and Z directions to move target die 702*t* to inspection platform 714 and deposit target die 702*t* back side 710 up on inspection platform 714, to reside in an unconstrained state. Scanning apparatus 716 in the form of a laser or optical profiler or other suitable scanning device is then moved over inspection platform 714 (or inspection platform 714 may be translatable to move under scanning apparatus 716) where the topography of back side 710 of target die 702*t* is scanned for warpage (i.e., nature and extent). Warpage values are then compared against predetermined values or ranges of values stored in computer memory and an associated sort and bin for target die 702*t* is selected and stored in memory. Target die 702*t* is then lifted from inspection platform 714 by bond tip 718 of bond head 720 movable at least in X, Y and Z directions, following which target die is placed on a stack of other dice 702 residing on an unsingulated die location 702*l* of a base substrate (e.g., semiconductor wafer) 722 or on an unsingulated die location 702*l*. The placement location of target die 702*t* may be selected based on the associated bin of target die 702*t* and the planarity or warpage of a die 702 or die location 702*l*** as previously determined or presumed (i.e., that a die location of a wafer will be planar). In such a manner, bond height variances between superimposed structures of an assembly may be limited to acceptable tolerances to avoid open or stretched (i.e., in the case of solder) joints.

In a modification of the above apparatus and method, vacuum-equipped pick arm 708 bearing target die **702*t* may be rotated about a horizontal axis to present target die 702*t* back side 710 facing up and the vacuum holding target die 702*t* may be released, leaving target die 702*t* in an unconstrained state. Scanning apparatus 716 in the form of a laser or optical profiler or other suitable scanning device may then be moved over target die 702*t* resting on pick arm 708 (or pick arm 708 may be translatable to move under scanning apparatus 716 and inverted, after which the vacuum is released) where the topography of back side 710 of target die 702*t*** is scanned for warpage (i.e., nature and extent).

In a variant of the embodiment of system 700, after scanning and as shown in FIG. 7B, a vacuum-equipped pick arm 708 may pick target die **702*t* by its back side 710 from inspection platform 714, rotated about a horizontal axis to invert target die 702*t* and present active surface 704, after which target die 702*t* is transferred to a transfer arm 712, which transfers target die 702*t* to a storage platform (e.g., reel of a tape and reel apparatus, or chip tray) 724 and deposits target die 702*t* in a location (e.g., pocket) 726 of storage platform 724 for further handling, storage and transport to another location, the bin associated with the target die 702*t* being associated with the location 726 and stored in non-transitory computer memory associated with storage platform 724. In such a manner, when target die 702*t* and other dice 702 stored in storage platform 724 are retrieved from their respective locations 726, the associated bin indicative of warpage characteristics thereof may be retrieved from memory and employed to fabricate assemblies as described with respect to FIG. 7A. In the process sequence depicted in the first portion of FIG. 7A through scanning, in combination with that of FIG. 7**B, the scanning function may be incorporated in the operational sequence of a tape and reel system, such as those offered by KLA, among others. In the context of this embodiment, it is also contemplated that multiple tapes may be employed in parallel, all the pockets of a given tape being assigned to a bin. Subsequently, retrieval of suitable dice from multiple tapes may be effected more rapidly, and there is no need for association of binned dice with individual pockets of a tape.

As in the case of FIG. 7A, in a modification of the apparatus and method of FIG. 7B, in lieu of using an inspection platform, vacuum-equipped pick arm 708 bearing target die 702*t* may be rotated about a horizontal axis to present target die 702*t* back side 710 facing up and the vacuum holding target die 702*t* may be released, leaving target die 702*t* in an unconstrained state. Scanning apparatus 716 in the form of a laser or optical profiler or other suitable scanning device may then be moved over target die 702*t* resting on pick arm 708 (or pick arm 708 may be translatable to move under scanning apparatus 716 and inverted, after which the vacuum is released) where the topography of back side 710 of target die 702*t* is scanned for warpage (i.e., nature and extent). Subsequently, pick arm 708 may again be rotated about a horizontal axis and translated to a storage platform 724 to deposit target die 702*t* in a location (e.g., pocket) 726 of storage platform 724 for further handling, storage and transport to another location, the bin associated with the target die 702*t* being associated with the location 726 and stored in non-transitory computer memory associated with storage platform 724.

In implementation of the variant of FIG. 7B, it is contemplated that each die 702 may be positively retained in a pocket 726 of a storage platform 724 to preserve its longitudinal, lateral and rotational (i.e., about a vertical axis relative to the plane of the storage platform) location within the pocket 726 during handling, storage and transport of the storage platform 724. By way of non-limiting examples, dice 702 may be retained by a thermal release adhesive on the pocket bottoms or by thermal release pins of the pockets constraining upper edges of the die. Further, an ultraviolet (UV) release adhesive may be employed on the pocket bottoms to retain dice 702. In addition, a solvent release adhesive may be employed on the pocket bottoms to simultaneously clean and release dice 702 being picked from a pocket.

In the variants of both FIGS. 7A and 7B, it is also contemplated that a scrap or divert bin may be assigned for any scanned die which fall out of any acceptable predetermined values in terms of nature or degree of warpage, or both. Similarly, if a single tape is used from which to retrieve dice for stacking, if a bin associated with a particular die indicates that it is unsuitable for immediate placement, the pick arm may place it in one of a number of divert areas (e.g., chip trays) for retrieval on the next occasion when that bin of die is suitable for placement in an assembly. For example, a die may have an associated bin indicating that die is unsuitable for placement in a first layer on a base wafer, or in a next to uppermost layer of a die stack, but is suitable for placement as a middle die in the stack.

It is also contemplated that modifications of the aforementioned systems and methods of FIGS. 5, 6, 7A and 7B may be implemented to eliminate a separate or dedicated inspection platform. For example, if a UV or thermal release mount tape is used for die singulation, scanning of a released die on the mount tape may be effected prior to picking. Similarly, if a wafer is singulated on a glass or silicon carrier wafer rather than on mount tape, a UV or thermal release adhesive may be employed to bond the wafer being singulated, after which singulated dice may be released from the carrier wafer using directed heat or UV energy from below the carrier wafer. In either instance, the scanning apparatus may be moved into and away from an inspection field over the singulated dice of the wafer to appropriate locations.

In any case, in any of the implementations of embodiments of the disclosure, the determination of the nature and extent of warpage of individual microelectronic components and, specifically, semiconductor dice may allow the assembly of multiple stacked components in a manner which minimizes bond line height variances between adjacent components. Stated another way, warpage mismatch between components, or the placement of a component exhibiting an unacceptable nature or degree, of warpage adjacent a substantially planar component may be minimized and even avoided.

System 700 may perform its programmed functions under control of controller 730, which may comprise one or more microprocessors operably coupled to memory for storage of operational programs and predetermined bin values as well as scanned warpage values, analytical programs for sorting and binning, and bin data for the scanned components. In the context of FIG. 7B, bin data for the scanned components placed in a storage platform may be transferred to further memory associated with a given storage platform, specific locations therein and stored components.

In embodiments, a microelectronic component processing apparatus comprises a platform for supporting at least one singulated microelectronic component in an unconstrained state, a device for measuring at least one of a nature and a degree of warpage of the at least one singulated microelectronic component supported on the platform, a controller comprising at least one microprocessor configured for initiating measurements of the at least one singulated microelectronic component on the platform by the device and receiving signals from the device including parameter values of data representative of the at least one of the nature and degree of warpage of the at least one singulated microelectronic component and memory operably coupled to the controller for receiving and storing the data.

In embodiments, a method of processing microelectronic components comprises measuring parameter values of at least one of a nature and a degree of warpage of singulated microelectronic components in an unconstrained state and sorting the singulated microelectronic components responsive to the measured parameter values of at least one of the nature and degree of warpage.

In embodiments, a method of processing microelectronic components comprises retrieving a singulated microelectronic component from a carrier structure, measuring parameter values of at least one of a nature of warpage and a degree of warpage of the singulated microelectronic component in an unconstrained state, characterizing the singulated microelectronic component responsive to the measured parameter values of at least one of the nature and degree of warpage and retrieving the characterized singulated microelectronic component from the platform and placing on an unsingulated microelectronic component location of a base substrate or on another singulated microelectronic component on the base substrate based at least in part on the characterization of the placed microelectronic component.

In embodiments, a microelectronic component assembly comprises two or more singulated microelectronic components of a thickness of about 65 μm or less exhibiting warpage and stacked on a planar singulated microelectronic component and a further planar singulated microelectronic component stacked on the two or more singulated microelectronic components of a thickness of about 65 μm or less exhibiting warpage, wherein a warpage of one of the two or more singulated microelectronic components adjacent each of the planar singulated microelectronic component and the further planar singulated microelectronic component has been measured and was selected to reduce a potential for open joints, stretched joints or short circuits among the planar singulated microelectronic component and the further planar singulated microelectronic component and the respective adjacent singulated microelectronic components.

In embodiments, a microelectronic component processing apparatus comprises a pick arm assembly operably coupled to the controller for retrieving singulated microelectronic components from a carrier structure, a device for measuring at least one of a nature and a degree of warpage of a singulated microelectronic component supported in an unconstrained state, a controller comprising at least one microprocessor configured for initiating retrieval of a singulated microelectronic component from the carrier structure with a pick arm of the pick arm assembly using a vacuum, inverting the singulated microelectronic component on the pick arm, releasing the vacuum and initiating measurements of the at least one singulated microelectronic component on the pick arm by the device and receiving signals from the device including parameter values of data representative of the at least one of the nature and degree of warpage of the at least one singulated microelectronic component and memory operably coupled to the controller for receiving and storing the data.

While certain illustrative embodiments have been described in connection with the figures, those of ordinary skill in the art will recognize and appreciate that embodiments encompassed by the disclosure are not limited to those embodiments explicitly shown and described herein. Rather, many additions, deletions, and modifications to the embodiments described herein may be made without departing from the scope of embodiments encompassed by the disclosure, such as those hereinafter claimed, including legal equivalents. In addition, features from one disclosed embodiment may be combined with features of another disclosed embodiment while still being encompassed within the scope of the disclosure.

What is claimed is:

1. A microelectronic component processing apparatus, comprising:

a platform for supporting at least one singulated microelectronic component in an unconstrained state;

a device for measuring at least one of a nature and a degree of warpage of the at least one singulated microelectronic component, the device configured to direct energy in at least one scanning path across a surface of the at least one singulated microelectronic component supported on the platform;

a controller comprising at least one microprocessor configured for initiating measurements of the at least one singulated microelectronic component on the platform by the device and receiving signals from the device including parameter values of data representative of the at least one of the nature and the degree of warpage of the at least one singulated microelectronic component;

memory operably coupled to the controller for receiving and storing the data;

a transfer assembly operably coupled to the controller for retrieving singulated microelectronic components from the platform and transferring each singulated microelectronic component to one of a number of bins assigned by the controller based on the parameter values of data associated with each singulated microelectronic component; and additional memory operably coupled to the controller and storing sets of predetermined parameter values of nature and degree of warpage, and the controller is further configured to sort the singulated microelectronic components for binning responsive to comparisons of parameter values of the data to predetermined parameter values of the sets stored in the additional memory.

2. The apparatus of claim 1, further comprising a pick assembly operably coupled to the controller for retrieving a number of singulated microelectronic components from a carrier structure and transferring the singulated microelectronic components to the platform.

3. The apparatus of claim 2, wherein the carrier structure comprises a mounting film supported on a film frame and supporting the number of singulated microelectronic components.

4. The apparatus of claim 2, wherein the carrier structure comprises a rigid carrier substrate supporting the number of singulated microelectronic components.

5. The apparatus of claim 1, wherein the sets of parameter values stored in the additional memory reside in one or more lookup tables.

6. The apparatus of claim 1, further comprising a component storage platform, comprising a number of pockets, each pocket configured for receiving a singulated microelectronic component, each pocket associated upon insertion therein of a singulated microelectronic component with the particular bin thereof, and further comprising storage memory for storing bin and associated pocket location of the inserted singulated microelectronic component.

7. The apparatus of claim 6, wherein the component storage platform further comprises one of a tape of a tape and reel apparatus, or a chip tray.

8. The apparatus of claim 6, further comprising a device for retrieving singulated microelectronic components from the component storage platform and transferring each respective measured singulated microelectronic component to an unsingulated microelectronic component location on a base substrate if the bin of the respective retrieved singulated microelectronic component stored in storage memory indicates acceptability in terms of the nature and the degree of warpage for placement on the unsingulated microelectronic component location.

9. The apparatus of claim 8, wherein the base substrate is a semiconductor wafer.

10. The apparatus of claim 8, wherein the device for retrieving singulated microelectronic components from the component storage platform and transferring each respective singulated microelectronic component to an unsingulated microelectronic component location on a base substrate is further operably coupled to memory for storing a location and bin of each singulated microelectronic component transferred to the base substrate.

11. The apparatus of claim 8, wherein the device for retrieving singulated microelectronic components from the component storage platform and transferring each respective singulated microelectronic component to an unsingulated microelectronic component location on a base substrate is further configured to, upon retrieving a respective singulated microelectronic component from the component storage platform, comparing a bin of the respective singulated microelectronic component stored in storage memory to locations and associated bins of singulated microelectronic components stored in storage memory of an existing layer of singulated microelectronic components of a microelectronic component stack on the base substrate and identifying a singulated microelectronic component of available microelectronic components of the existing layer for transfer thereto of the respective singulated microelectronic component thereon to minimize at least one of warpage mismatch or bond line height variance.

12. The apparatus of claim 8, wherein the device for retrieving singulated microelectronic components from the component storage platform and transferring each respective singulated microelectronic component to an unsingulated microelectronic component location on a base substrate is further configured to, upon retrieving a respective singulated microelectronic component from the component storage platform for transfer to a next to uppermost microelectronic component location of a microelectronic component stack, determining if the bin of the respective retrieved singulated microelectronic component indicates acceptability in terms of the nature and the degree of warpage for placement within the microelectronic component stack under a substantially planar uppermost microelectronic component.

13. A method of processing microelectronic components, comprising:

measuring parameter values of at least one of a nature and a first degree of warpage of singulated microelectronic components in an unconstrained state at a first temperature;

predicting second parameter values including a second degree of warpage of the singulated microelectronic components expected at a second temperature; and sorting the singulated microelectronic components responsive to the measured parameter values of at least one of the nature and the first degree of warpage at the first temperature and the second parameter values including the second degree of warpage expected at the second temperature.

14. The method of claim 13, further comprising characterizing the singulated microelectronic components by comparing the measured parameter values of at least one of the nature and the first degree of warpage thereof to predetermined parameter values relating to the at least one of the nature and the first degree of warpage.

15. The method of claim 14, wherein the predetermined parameter values each comprise a range of values of at least one of the nature and the first degree of warpage.

16. The method of claim 14, further comprising characterizing the singulated microelectronic components by comparing the measured parameter values of the nature and the first degree of warpage thereof to predetermined parameter values comprising sets of values relating to the nature and the first degree of warpage.

17. The method of claim 13, wherein if one or more measured parameter values or expected second parameter values of a singulated microelectronic component fall outside of predetermined limits, the singulated microelectronic component is rejected for use.

18. The method of claim 13, further comprising using predetermined parameter values stored in one or more lookup tables for sorting the singulated microelectronic components.

19. The method of claim 13, further comprising transferring the singulated microelectronic components to a storage platform, associating the sort of each singulated microelectronic component with a location of the storage platform, and storing the associated sort in computer memory.

20. The method of claim 19, wherein the locations of the storage platform are pockets in either a tape of a tape and reel apparatus, or pockets in a chip tray, and transferring the singulated microelectronic components comprises inserting the singulated microelectronic components in the pockets.

21. The method of claim 19, further comprising retrieving singulated microelectronic components from storage platform locations and placing the retrieved singulated microelectronic components on microelectronic component locations of a base substrate selected at least in part based on the respective sorts of the retrieved singulated microelectronic component.

22. A method of processing microelectronic components, comprising:

retrieving a singulated microelectronic component from a carrier structure;

measuring parameter values of at least one of a nature of warpage and a degree of warpage of the singulated microelectronic component in an unconstrained state;

characterizing the singulated microelectronic component responsive to the measured parameter values of at least one of the nature and the degree of warpage; and placing the characterized singulated microelectronic component on an unsingulated microelectronic component location of a base substrate or on another singulated microelectronic component on the base substrate based at least in part on the characterization of the placed microelectronic component.

23. The method of claim 22, wherein the carrier structure comprises a mounting film supported by a film frame, the singulated microelectronic component is one of an array of singulated microelectronic components on the mounting film, and the retrieving from the carrier structure is effected by a pick apparatus using a vacuum.

24. The method of claim 23, wherein the base substrate is a semiconductor wafer, the unsingulated microelectronic component locations are unsingulated die locations, the singulated microelectronic components are singulated semiconductor dice, and further comprising singulating the semiconductor dice on the mounting film prior to retrieving, measuring, and characterizing the singulated semiconductor die.

25. The method of claim 22, wherein the carrier structure comprises a rigid carrier wafer, the singulated microelectronic component is one of an array of singulated microelectronic components on the rigid carrier wafer, and the retrieving from the carrier structure is effected by a pick apparatus applying a vacuum.

26. The method of claim 25, wherein the base substrate is a semiconductor wafer, the unsingulated microelectronic component location is an unsingulated die location, the array of singulated microelectronic components are singulated semiconductor dice adhered to the carrier structure, and further comprising reducing adherence of at least one of the singulated semiconductor dice to be retrieved from the carrier structure prior to retrieving, measuring, and characterizing at least one of the singulated semiconductor dice.

27. A microelectronic component processing apparatus, comprising:

a pick arm assembly operably coupled to a controller for retrieving singulated microelectronic components from a carrier structure;

a device for measuring at least one of a nature and a degree of warpage of a singulated microelectronic component supported in an unconstrained state, the device configured to move along at least one scanning path;

the controller comprising at least one microprocessor configured for initiating retrieval of a singulated microelectronic component from the carrier structure with a pick arm of the pick arm assembly using a vacuum, inverting the singulated microelectronic component on the pick arm, releasing the vacuum and initiating measurements of the at least one singulated microelectronic component on the pick arm by the device and receiving signals from the device including parameter values of data representative of the at least one of the nature and the degree of warpage of the at least one singulated microelectronic component; and memory operably coupled to the controller for receiving and storing the data;

a component storage platform, comprising a number of pockets, each pocket configured for receiving a singulated microelectronic component, each pocket associated upon insertion therein of a singulated microelectronic component with the particular bin thereof, and further comprising storage memory for storing bin and associated pocket location of the inserted singulated microelectronic component; and a device for retrieving singulated microelectronic components from the component storage platform and transferring each respective measured singulated microelectronic component to an unsingulated microelectronic component location on a base substrate if the bin of the respective retrieved singulated microelectronic component stored in storage memory indicates acceptability in terms of the nature and the degree of warpage for placement on the unsingulated microelectronic component location.

28. The apparatus of claim 27, wherein the carrier structure comprises a mounting film supported on a film frame or a rigid carrier substrate supporting a number of singulated microelectronic components.

29. The apparatus of claim 27, wherein the pick arm is further configured to transfer each singulated microelectronic component to one of a number of bins assigned by the controller based on the parameter values of data associated with each singulated microelectronic component.

30. The apparatus of claim 29, further comprising additional memory operably coupled to the controller and storing sets of predetermined parameter values of the nature and the degree of warpage, and the controller is further configured to sort the singulated microelectronic components for binning responsive to comparisons of parameter values of the data to predetermined parameter values of the sets stored in the additional memory.

31. The apparatus of claim 30, wherein the sets of parameter values stored in the additional memory reside in one or more lookup tables.

32. The apparatus of claim 27, wherein the component storage platform further comprises one of a tape of a tape and reel apparatus, or a chip tray.

33. The apparatus of claim 27, wherein the base substrate is a semiconductor wafer.

34. The apparatus of claim 27, wherein the device for retrieving singulated microelectronic components from the component storage platform and transferring each respective singulated microelectronic component to an unsingulated microelectronic component location on a base substrate is further operably coupled to memory for storing a location and bin of each singulated microelectronic component transferred to the base substrate.

35. The apparatus of claim 27, wherein the device for retrieving singulated microelectronic components from the component storage platform and transferring each respective singulated microelectronic component to an unsingulated microelectronic component location on a base substrate is further configured to, upon retrieving a respective singulated microelectronic component from the component storage platform, comparing a bin of the respective singulated microelectronic component stored in storage memory to locations and associated bins of singulated microelectronic components stored in storage memory of an existing layer of singulated microelectronic components of a microelectronic component stack on the base substrate and identifying a singulated microelectronic component of available microelectronic components of the existing layer for transfer thereto of the respective singulated microelectronic component thereon to minimize at least one of warpage mismatch or bond line height variance.

36. The apparatus of claim 27, wherein the device for retrieving singulated microelectronic components from the component storage platform and transferring each respective singulated microelectronic component to an unsingulated microelectronic component location on a base substrate is further configured to, upon retrieving a respective singulated microelectronic component from the component storage platform for transfer to a next to uppermost microelectronic component location of a microelectronic component stack, determining if the bin of the respective retrieved singulated microelectronic component indicates acceptability in terms of the nature and the degree of warpage for placement within the microelectronic component stack under a substantially planar uppermost microelectronic component.

* * * * *